United States Patent
Sekiguchi et al.

(10) Patent No.: US 10,627,173 B2
(45) Date of Patent: Apr. 21, 2020

(54) FLOW PATH MEMBER, AND HEAT EXCHANGER AND SEMICONDUCTOR MANUFACTURING APPARATUS USING SAME

(71) Applicant: KYOCERA Corporation, Kyoto-shi, Kyoto (JP)

(72) Inventors: Keiichi Sekiguchi, Satsumasendai (JP); Kazuhiko Fujio, Satsumasendai (JP); Yuusaku Ishimine, Kirishima (JP)

(73) Assignee: KYOCERA Corporation, Kyoto (JP)

( * ) Notice: Subject to any disclaimer, the term of this patent is extended or adjusted under 35 U.S.C. 154(b) by 1064 days.

(21) Appl. No.: 14/402,248

(22) PCT Filed: May 30, 2013

(86) PCT No.: PCT/JP2013/065118
§ 371 (c)(1),
(2) Date: Nov. 19, 2014

(87) PCT Pub. No.: WO2013/180250
PCT Pub. Date: Dec. 5, 2013

(65) Prior Publication Data
US 2015/0137442 A1 May 21, 2015

(30) Foreign Application Priority Data
May 30, 2012 (JP) .................................. 2012-123287

(51) Int. Cl.
*F28F 13/12* (2006.01)
*F24F 3/12* (2006.01)
(Continued)

(52) U.S. Cl.
CPC ................ *F28F 13/12* (2013.01); *F28F 3/12* (2013.01); *F28F 13/02* (2013.01); *F28F 13/14* (2013.01);
(Continued)

(58) Field of Classification Search
CPC .......... F28F 13/12; F28F 13/185; F28F 13/14; F28F 13/02; F28F 2215/04; F28F 3/02;
(Continued)

(56) References Cited

U.S. PATENT DOCUMENTS 6,216,343 B1 4/2001 Leland et al.
6,296,048 B1 * 10/2001 Sauer .................. H01L 21/4882
165/185
(Continued)

FOREIGN PATENT DOCUMENTS

DE 4340378 A1 6/1994
DE 299 04 046 U1 6/1999
(Continued)

OTHER PUBLICATIONS

English Machine Translation of JP2001118972 A Torimizu et al.*
(Continued)

*Primary Examiner* — Rakesh K Dhingra
*Assistant Examiner* — Laureen Chan
(74) *Attorney, Agent, or Firm* — Procopio Cory Hargreaves and Savitch LLP

(57) ABSTRACT

A flow path member includes a lid portion, a bottom plate portion, and side walls provided between the lid portion and the bottom plate portion, a flow path in which a fluid flows is configured with the lid portion, the side walls, and the bottom plate portion, a portion of a surface of the side walls on the flow path side includes a coarse portion that is coarser than the other portions.

10 Claims, 8 Drawing Sheets

(51) Int. Cl.
*F28F 13/18* (2006.01)
*F28F 13/14* (2006.01)
*F28F 13/02* (2006.01)
*H01L 21/683* (2006.01)
*F28D 21/00* (2006.01)
*H01L 21/67* (2006.01)
*H01J 37/32* (2006.01)
*H01L 21/687* (2006.01)
*F28F 3/12* (2006.01)

(52) U.S. Cl.
CPC ...... *F28F 13/185* (2013.01); *H01J 37/32724* (2013.01); *H01L 21/6833* (2013.01); *H01L 21/68785* (2013.01); *F28D 2021/0029* (2013.01); *F28F 2215/04* (2013.01); *H01L 21/67103* (2013.01); *Y10T 137/2087* (2015.04)

(58) Field of Classification Search
CPC ........... H01L 21/6833; H01L 21/67103; H01L 21/683; H01L 21/6831; H01L 21/68785; H01L 23/467; H01L 23/473; F28D 2021/0029; Y10T 137/2087; H01J 37/32715; H01J 37/32724; C23C 16/466
See application file for complete search history.

(56) References Cited

U.S. PATENT DOCUMENTS

| | | | | |
|---|---|---|---|---|
| 6,951,587 B1* | 10/2005 | Narushima | ......... | C23C 16/4586 118/728 |
| 2004/0177949 A1 | 9/2004 | Shimoya et al. | | |
| 2007/0163749 A1 | 7/2007 | Miyahara | | |
| 2007/0216024 A1 | 9/2007 | Ono et al. | | |
| 2008/0179972 A1* | 7/2008 | Aoki | ................... | H01L 21/4878 310/52 |
| 2009/0303735 A1* | 12/2009 | Chen | ......................... | F21K 9/00 362/373 |
| 2010/0122798 A1* | 5/2010 | Hashimoto | ......... | F28D 15/0266 165/104.21 |
| 2010/0139631 A1 | 6/2010 | Geskes et al. | | |
| 2011/0207243 A1* | 8/2011 | Tandou | ................... | F25B 39/02 438/5 |
| 2012/0180991 A1 | 7/2012 | Viswanathan et al. | | |

FOREIGN PATENT DOCUMENTS

| | | | | |
|---|---|---|---|---|
| EP | 1 205 964 A1 | | 5/2002 | |
| GB | 1 339 542 | | 12/1973 | |
| JP | 03-142861 A | | 6/1991 | |
| JP | 03142861 A | * | 6/1991 | |
| JP | 2001-118972 A | | 4/2001 | |
| JP | 2001118972 A | * | 4/2001 | ......... H01L 23/3672 |
| JP | 2004-144460 A | | 5/2004 | |
| JP | 2007-035878 A | | 2/2007 | |
| JP | 2007-103748 A | | 4/2007 | |
| JP | 2007-123547 A | | 5/2007 | |
| JP | 2007-251002 A | | 9/2007 | |
| JP | 2009-176881 A | | 8/2009 | |
| JP | 2009-530582 A | | 8/2009 | |
| JP | 2009176881 A | * | 8/2009 | |
| JP | 2011-216517 A | | 10/2011 | |

OTHER PUBLICATIONS

English Machine Translation of JP2009176881 A Iwashima et al.*
English Machine Translation of JPH03142861 A Tate et al.*
International Search Report (Form PCT/ISA/210) dated Aug. 27, 2013 issued for PCT/JP2013/065118.
The extended European search report dated Jan. 25, 2016 issued in counterpart European Application No. 13 79 6288.

* cited by examiner

FLOW PATH MEMBER, AND HEAT EXCHANGER AND SEMICONDUCTOR MANUFACTURING APPARATUS USING SAME

TECHNICAL FIELD

The present invention relates to a flow path member, and a heat exchanger and a semiconductor manufacturing apparatus using the same.

BACKGROUND ART

A holding stage including a flow path (hereinafter, referred to as a flow path member) is used for holding a wafer which is a substrate with semiconductor components, and in a manufacturing or inspection process, heat exchange such as heating or cooling of the wafer is performed by circulating a fluid at a high temperature or at a low temperature in this flow path.

PTL 1, for example, discloses a plate heat exchanger composed of a plurality of plates in which fluid-flow guide channels are formed as a system of channels in such a way that a substantially meandering profile of the fluid flow is obtained over the surface area of the respective plates, the side walls of the guide channels having a plurality of apertures, which lead to turbulence of the fluid flow.

CITATION LIST

Patent Literature

PTL 1: Japanese Unexamined Patent Application Publication (Translation of PCT Application) No. 2009-530582

SUMMARY OF INVENTION

Technical Problem

Particularly, in recent years, a flow path member which can efficiently heat or cool a wafer is required, that is, a flow path member having improved heat exchange efficiency is required.

Therefore, an object of the invention is to provide a flow path member having improved heat exchange efficiency, a heat exchanger, and a semiconductor manufacturing apparatus using the flow path member.

Solution to Problem

According to an embodiment of the invention, there is provided a flow path member including: a first wall; a second wall; and a third wall which is provided between the first wall and the second wall, in which a flow path in which a fluid flows is configured with the first wall, the second wall, and the third wall, and a portion of a surface of the third wall on the flow path side includes a coarse portion that is coarser than the other portions.

According to an embodiment of the invention, there is provided a heat exchanger in which a metal member is provided on the surface or inside of at least one of the first wall and the second wall of the flow path member.

According to an embodiment of the invention, there is provided a semiconductor manufacturing apparatus including: a heat exchanger which is formed by providing a metal member in at least one of the first wall and the second wall of the flow path member, in which the metal member is an electrode for attracting a wafer.

Advantageous Effects of Invention

According to the flow path member of the invention, the coarse portion that is coarser than the other portion is provided in a part of the surface of the third wall on the flow path side, and thus, a turbulent flow easily occurs in the fluid, and it is possible to increase the heat exchange efficiency.

According to the heat exchanger of the invention, the metal member is provided on the surface or inside of at least one of the first wall and the second wall of the flow path member, and thus, it is possible to provide a heat exchanger having high heat exchange efficiency.

According to the semiconductor manufacturing apparatus of the invention, the metal member is provided in at least one of the first wall and the second wall of the flow path member and the metal member is an electrode for attracting a wafer, and thus, it is possible to provide a semiconductor manufacturing apparatus which can highly accurately manufacture semiconductor components.

BRIEF DESCRIPTION OF DRAWINGS

FIG. 1 shows an example of a flow path of the embodiment.

FIG. 2 shows another example of a flow path of the embodiment.

FIG. 3 shows still another example of a flow path of the embodiment.

FIG. 4 shows still another example of a flow path of the embodiment.

FIG. 5 shows still another example of a flow path of the embodiment.

FIG. 6 shows still another example of a flow path of the embodiment.

DESCRIPTION OF EMBODIMENTS

Hereinafter, an example of a flow path member according to an embodiment of the invention will be described.

Figure 1A:
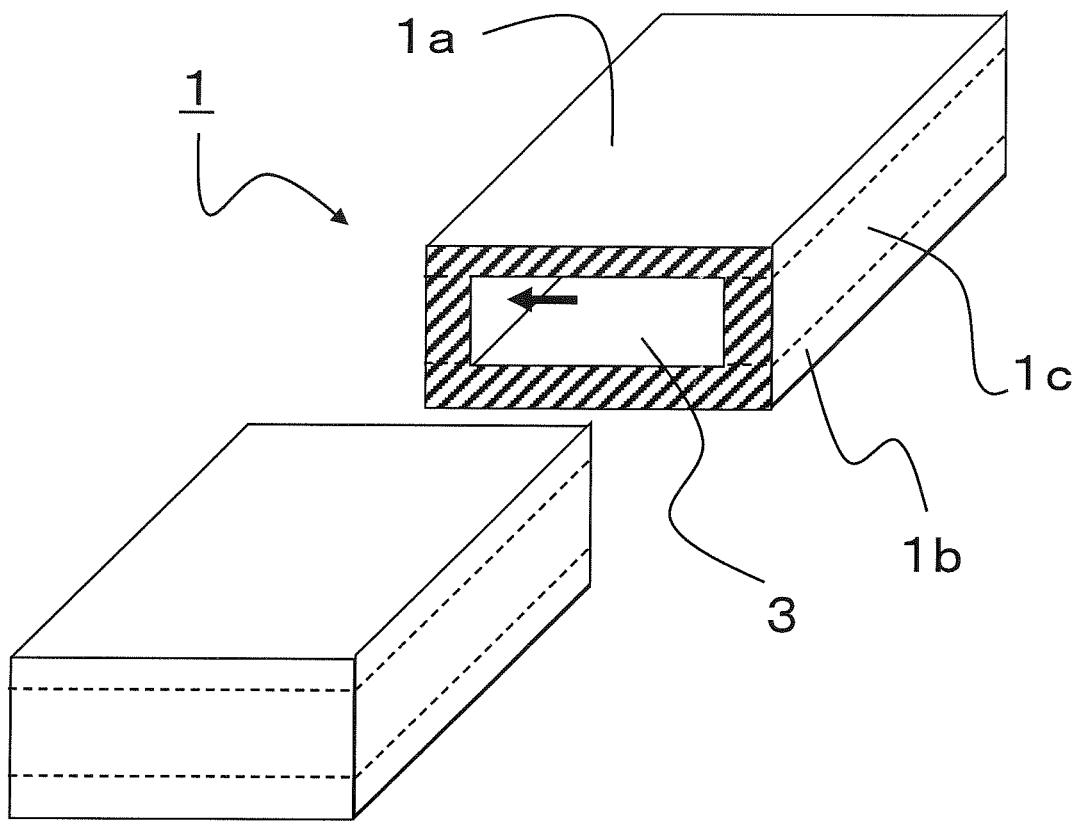
FIG. 1(a) shows an external perspective view and a perspective view illustrating a cross section vertical to a direction in which a fluid flows.
Figure 1B:
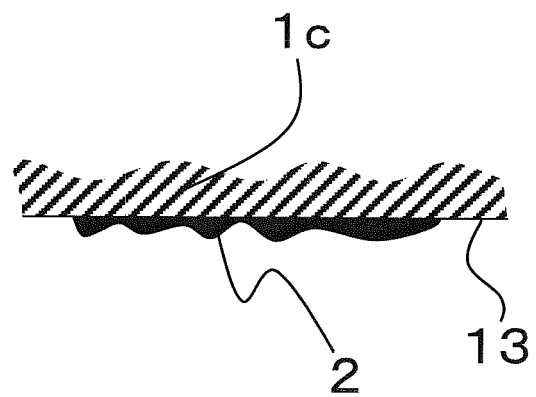
FIG. 1(b) is a transverse cross-sectional view of a partially enlarged portion of a third wall indicated by an arrow in FIG. 1(a).

FIG. 1 shows an example of a flow path of the embodiment. FIG. 1(a) shows an external perspective view and a perspective view illustrating a cross section vertical to a direction in which a fluid flows, and FIG. 1(b) is a transverse cross-sectional view of a partially enlarged portion of a third wall indicated by an arrow in FIG. 1(a). In the drawings described below, the same configuration will be described using the same reference numerals.

As shown in FIG. 1(a), a flow path member 1 includes a first wall 1a, third wall 1c, and a second wall 1b, and a flow path 3 in which gas or liquid for heating or cooling a wafer, which will be described later, flows, is configured with the first wall 1a, the third wall 1c, and the second wall 1b.

A coarse portion 2 as shown in FIG. 1(b) is included in a part of a surface of the third wall 1c on the flow path 3 side.

When the coarse portion 2 is provided on the entire surface of the third wall 1c on the flow path 3 side, the flow of the fluid is obstructed, and heat exchange efficiency easily decreases. Accordingly, it is important to provide the coarse portion 2 which is coarser than the other portion 13, in a part of the surface of the third wall 1c on the flow path 3 side. Therefore, it is possible to suppress obstruction of the flow of the fluid, compared to a case where the coarse portion 2 is provided on the entire surface of the third wall 1c on the flow path 3 side. In addition, when the coarse portion 2 which is coarser than the other portion 13 is provided in a part of the surface of the third wall 1c on the flow path 3 side, a turbulent flow easily occurs in the fluid. Thus, it is possible to increase the heat exchange efficiency of the flow path member 1.

The coarse portion 2 described herein is a part of the portion configuring the surface of the third wall 1c on the flow path 3 side which is coarser than the other portion 13 configuring the surface thereof on the flow path 3 side (for example, in a view of surface texture of the surface of the third wall 1c on the flow path 3 side (arithmetic average roughness: Ra, maximum height: Ry, and ten point mean roughness: Rz disclosed in JIS B0601, 1994), a part of the portion configuring the surface of the third wall 1c on the flow path 3 side is coarser than the other portion 13 configuring the surface thereof on the flow path 3 side).

In order to suppress obstruction of the flow of the fluid and to increase the heat exchange efficiency, the coarse portion 2 preferably occupies 5% to 30% of the entire surface of the third wall 1c on the flow path side.

The state of the coarse portion 2 can be checked and a ratio of an area thereof can be calculated using a well-known surface roughness meter or image analysis apparatus, for example.

Herein, the flow path member 1 is preferably manufactured with ceramics. When the flow path member 1 is manufactured with ceramics, it is possible to use gas or liquid having high corrosiveness as the fluid flowing to the flow path 3, and to provide the flow path member 1 having durability or corrosion resistance which is not provided in metals, and excellent insulation property. Examples of the material of ceramics are alumina, zirconia, silicon nitride, aluminum nitride, silicon carbide, boron carbide, cordierite, mullite, or a combined material thereof.

The flow path member 1 of the embodiment is desirably formed of a silicon carbide sintered body using silicon carbide as a main component. Herein, the main component is a component occupying 80% by weight or more, among four components configuring the flow path member 1. When the flow path member 1 of the embodiment is formed of a silicon carbide sintered body using silicon carbide as a main component, high heat conductivity is obtained, in addition to excellent mechanical properties or corrosion resistance, and accordingly the heat exchange efficiency is improved. In addition, since a specific gravity is smaller than that of the other ceramics, for example, alumina, it is possible to realize weight reduction, when it is necessary for the large-scaled flow path member 1.

The material of the flow path member 1 can be checked using an X-ray diffraction analysis, by cutting out a sample having a predetermined size from the flow path member 1. The content thereof can be checked by performing an energy dispersion type X-ray (EDS) analysis using a scanning electron microscope (SEM). The content thereof can also be checked using an ICP emission spectral analysis or a fluorescent X-ray analysis.

It is possible to allow the fluid to stay in the heat exchanger for a long period of time (to set a length of the flow path greater), by forming the flow path 3 of the flow path member 1 in a meandering shape or a spiral shape, and therefore, it is possible to efficiently perform the heat exchange.

Figure 2A:
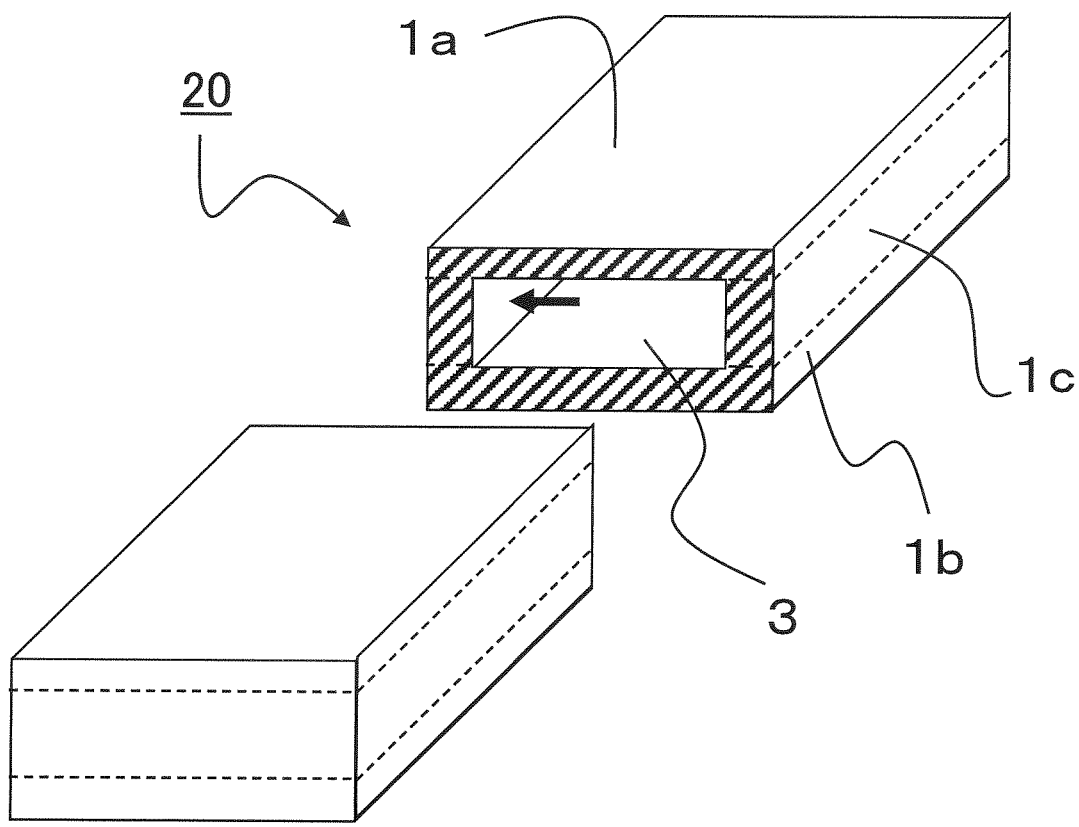
FIG. 2(a) shows an external perspective view and a perspective view illustrating a cross section vertical to a direction in which a fluid flows.
Figure 2B:
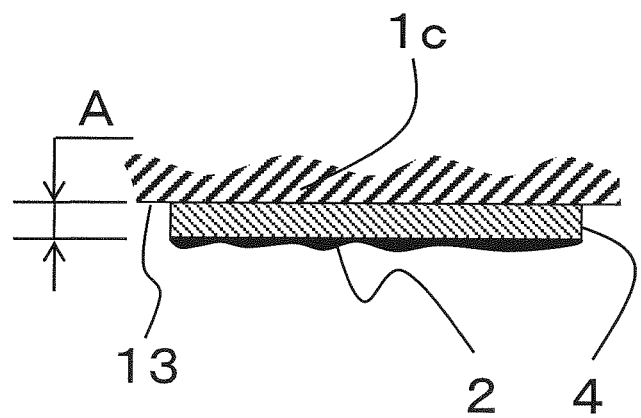
FIG. 2(b) is a transverse cross-sectional view of a partially enlarged portion of a third wall indicated by an arrow in FIG. 2(a).

FIG. 2 shows another example of the flow path of the embodiment. FIG. 2(a) shows an external perspective view and a perspective view illustrating a cross section vertical to a direction in which the fluid flows, and FIG. 2(b) is a transverse cross-sectional view of a partially enlarged portion of the third wall indicated by an arrow of FIG. 2(a).

In the flow path member 20 of the embodiment shown in FIG. 2(a), as shown in FIG. 2(b), the third wall 1c includes a protrusion 4 which protrudes to the flow path 3 side, and the coarse portion 2 is provided on an end surface of the protrusion 4.

With such a configuration, the turbulent flow occurs due to the coarse portion 2 on the end surface of the protrusion 4 and the fluid comes in contact with the protrusion 4, and therefore, the turbulent flow becomes large, and it is possible to further increase the heat exchange efficiency.

When the protrusion 4 is provided and the coarse portion 2 is provided on the end surface of the protrusion 4, a portion where the turbulent flow occurs approaches the center of the flow path 3, and accordingly, the fluid is easily stirred and it is possible to further increase the heat exchange efficiency due to the occurrence of the turbulent flow. Therefore, it is possible to further increase the heat exchange efficiency of the flow path member 20.

When the protrusion 4 has an excessively great height, the flow of the fluid may be greatly obstructed and the heat exchange efficiency may decrease. Accordingly, in order not to excessively obstruct the flow of the fluid, the height thereof is preferably from 500 µm to 3000 µm.

The height of the protrusion 4 herein is a dimension of a part A shown in FIG. 2(b), and in a measuring method thereof, a cross section obtained by cutting a portion including the protrusion 4 can be measured using a well-known measuring microscope.

The plurality of protrusions 4 are preferably provided along a direction in which the fluid flows.

With such a configuration, it is possible to cause the turbulent flow to more easily occur in the fluid which flows through the flow path 3. Accordingly, it is possible to increase the heat exchange efficiency of the flow path member 20, to suppress occurrence of bias in the heat exchange due to the occurrence of the turbulent flow in the plurality of portions in the flow path 3, and to make the temperature of the entire flow path member 20 approach a constant value, and therefore it is possible to suppress the break of the flow path member 20 with respect to thermal stress.

In addition, the plurality of protrusions 4 are preferably provided in a direction from the first wall 1a to the second wall 1b.

With such a configuration, it is possible to efficiently perform the heat exchange over the entire flow path member 20, without the bias of the fluid to the first wall 1a side or the second wall 1b side. Accordingly, it is possible to further increase the heat exchange efficiency of the flow path member 20.

The protrusions 4 adjacent to each other in a direction in which the fluid flows, are preferably provided to be shifted in a direction from the first wall 1a to the second wall 1b.

With such a configuration, the fluid flows so as to thread between the protrusions 4, and therefore, is easily stirred. Accordingly, it is possible to further increase the heat exchange efficiency of the entire flow path member 20, and to make the temperature of the entire flow path member 20 approach a constant value, and therefore it is possible to suppress the break of the flow path member 20 due to thermal stress.

In order to increase the heat exchange efficiency of the flow path member 20 with the occurrence of turbulent flow of the fluid while suppressing the obstruction of the flow of the fluid, it is preferable to provide a wide area of the end surface of the protrusion 4, and as the configuration thereof, the center of the end surface of the protrusion 4 is preferably curved to the third wall 1c side.

With such a configuration, it is possible to widen the surface area of the protrusion 4, and more turbulent flow occurs due to the fluid being in further contact with the coarse portion 2 when flowing to the third wall 1c side, and therefore it is possible to further increase the heat exchange efficiency of the flow path member 20.

Figure 3A:
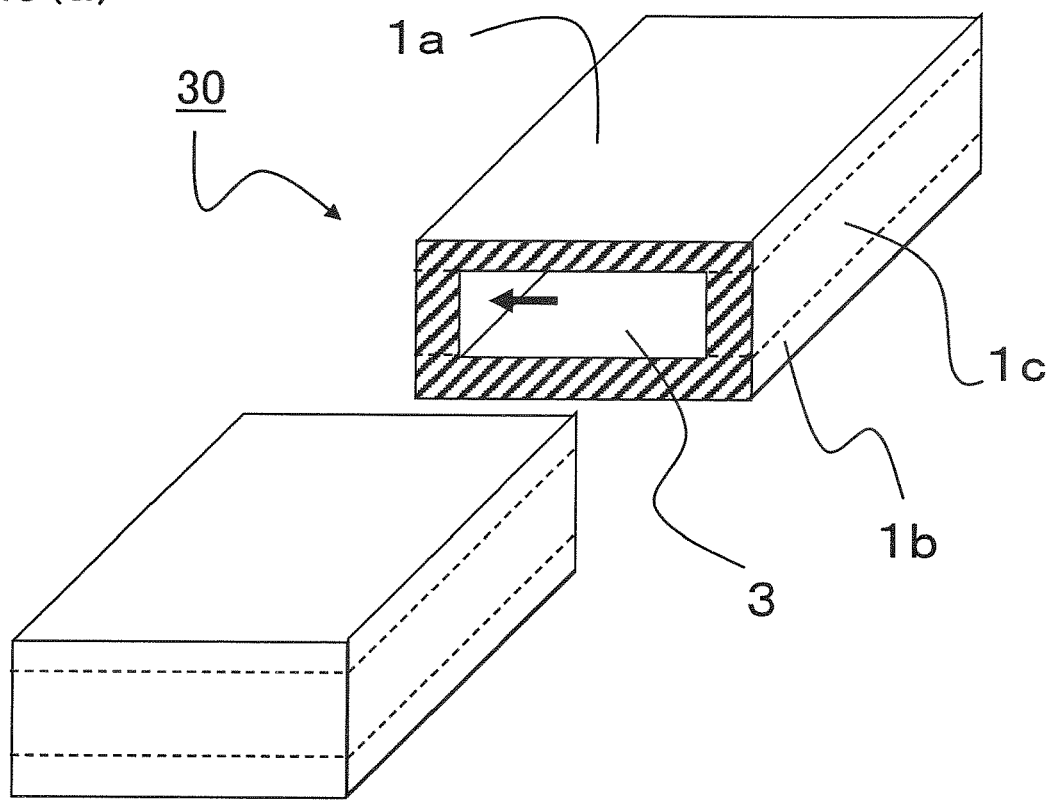
FIG. 3(a) shows an external perspective view and a perspective view illustrating a cross section vertical to a direction in which a fluid flows.
Figure 3B:
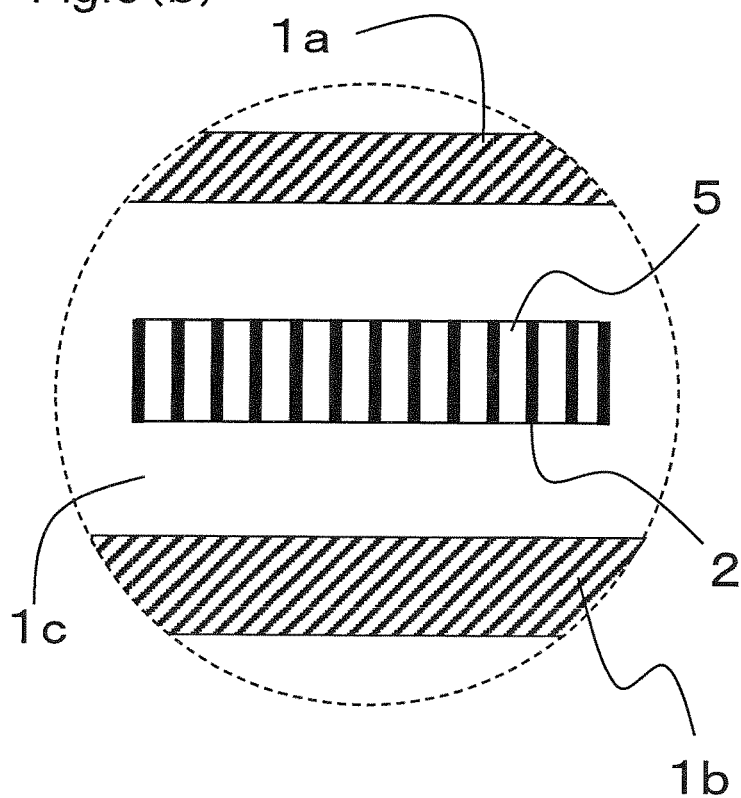
FIG. 3(b) is a cross-sectional view showing a partially extracted portion of a cross section along a direction in which a fluid flows.
Figure 3C:
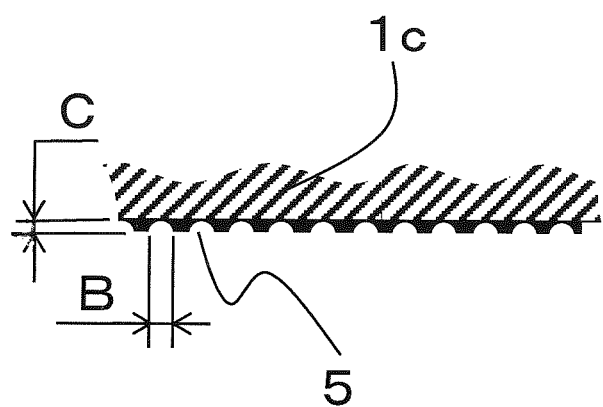
FIG. 3(c) is a partially enlarged view of a third wall indicated by an arrow in FIG. 3(a).

FIG. 3 shows still another example of a flow path of the embodiment. FIG. 3(a) shows an external perspective view and a perspective view illustrating a cross section vertical to a direction in which a fluid flows, FIG. 3(b) is a cross-sectional view showing a partially extracted portion of a cross section along a direction in which a fluid flows, and FIG. 3(c) is a partially enlarged view of a third wall indicated by an arrow in FIG. 3(a).

As shown in FIGS. 3(b) and 3(c), in a flow path member 30 of the embodiment, the coarse portion 2 includes grooves 5 which extend from the first wall 1a side to the second wall 1b side.

With such a configuration, it is possible to cause the turbulent flow to more easily occur in the fluid which flows through the flow path 3 due to the grooves 5. Accordingly, it is possible to increase the heat exchange efficiency of the flow path member 30, to suppress occurrence of bias in the heat exchange due to the occurrence of the turbulent flow in the plurality of portions in the flow path 3, and to make the temperature of the entire flow path member 30 approach a constant value, and therefore it is possible to suppress the break of the flow path member 30 with respect to thermal stress.

Herein, a width of the grooves 5 may be from 50 μm to 1000 μm and a depth thereof may be from 20 μm to 500 μm, and when these are in the ranges described above, it is possible to cause the turbulent flow to more easily occur, without stagnant flow of the fluid. The width of the grooves 5 herein is a dimension of a part B shown in FIG. 3(c) and a depth thereof is a dimension of a part C.

Figure 4A:
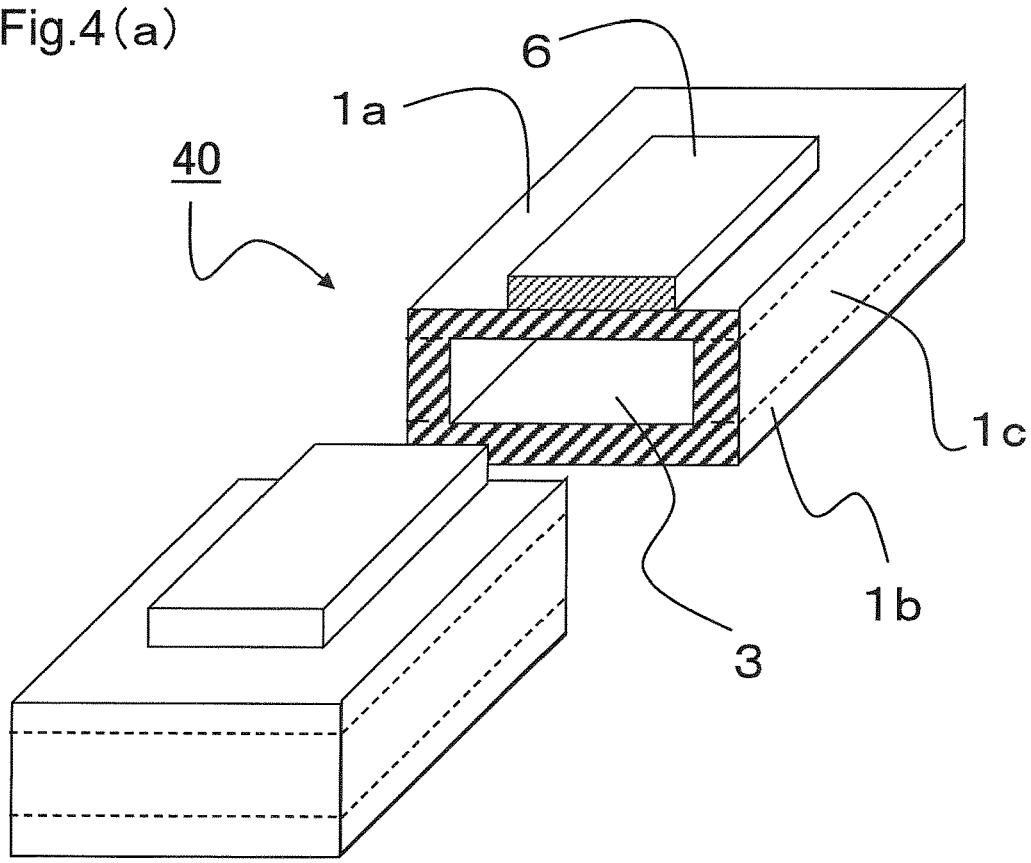
FIG. 4(a) shows an external perspective view and a perspective view illustrating a cross section vertical to a direction in which a fluid flows.
Figure 4B:
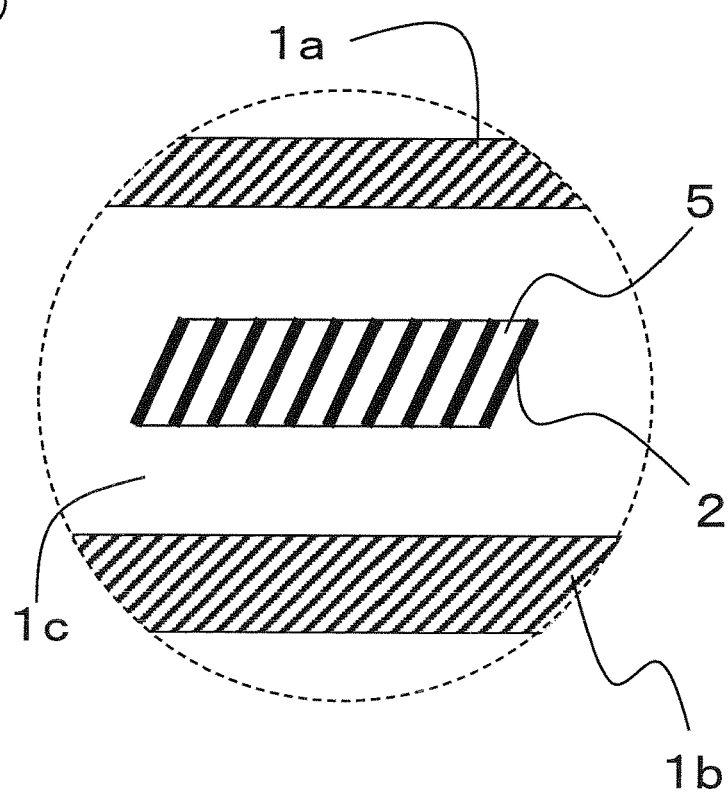
FIG. 4(b) is a cross-sectional view showing a partially extracted portion of a cross section along a direction in which a fluid flows.

FIG. 4 shows still another example of a flow path of the embodiment. FIG. 4(a) shows an external perspective view and a perspective view illustrating a cross section vertical to a direction in which a fluid flows, and FIG. 4(b) is a cross-sectional view showing a partially extracted portion of a cross section along a direction in which a fluid flows. The cross section of the grooves on the third wall is the same as in FIG. 3 and therefore the description thereof is omitted, and a heat generation member is disposed on the first wall of the flow path member.

In a flow path member 40 shown in FIG. 4, the first wall 1a is a lid, the second wall 1b is a bottom plate, and the third wall 1c is a side wall. A heat generation member mounted area (not shown) is provided in the first wall 1a which is the lid of the flow path member 40, and the heat generation member 6 is disposed in the heat generation member mounted area. The heat generation member mounted area can be appropriately set according to the heat generation member 6 as a target, and can be set as the entire surface of the first wall 1a or the second wall 1b, for example.

As shown in FIGS. 4(a) and 4(b), in the flow path member 40 of the embodiment, the heat generation member 6 is disposed on the surface of the first wall 1a (lid), and the grooves 5 are inclined so as to flow the fluid to the heat generation member mounted area (that is, heat generation member 6). The heat generation member 6 may be disposed on the second wall 1b (bottom plate).

With such a configuration, some of the fluid easily flows to the heat generation member mounted area of the first wall 1a or the second wall 1b. Accordingly, the heat exchange between the fluid and the first wall 1a or the second wall 1b, that is, the heat exchange between the fluid and the heat generation member mounted area easily occurs, and it is possible to more efficiently perform the heat exchange.

Particularly, when the heat generation member 6 is disposed on the surface of the first wall 1a or the second wall 1b, a thickness of the first wall 1a or the second wall 1b may be set as small as possible, to an extent which causes no problems, in order to increase the heat exchange efficiency between the fluid flowing through the fluid 3 and the heat generation member 6.

The heat generation member 6 is not only a wafer, which will be described later, but is an electronic component having a heat generation function such as an LED element or a power semiconductor.

Figure 5A:
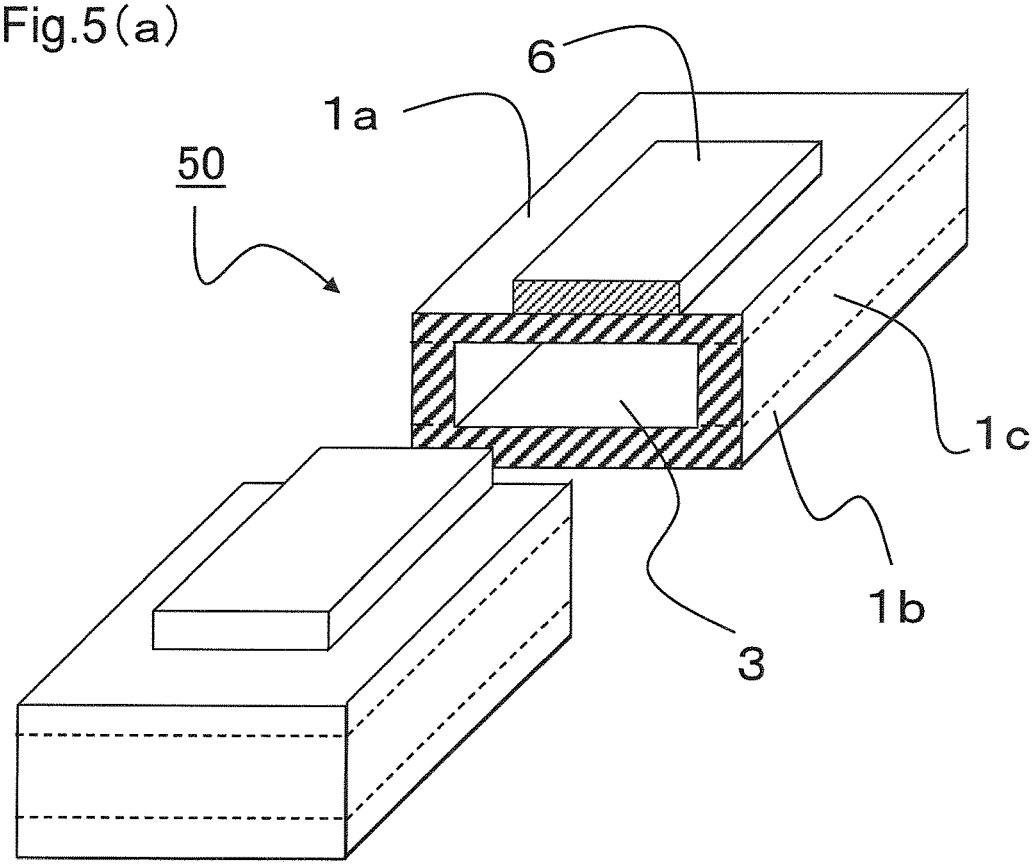
FIG. 5(a) shows an external perspective view and a perspective view illustrating a cross section vertical to a direction in which a fluid flows.
Figure 5B:
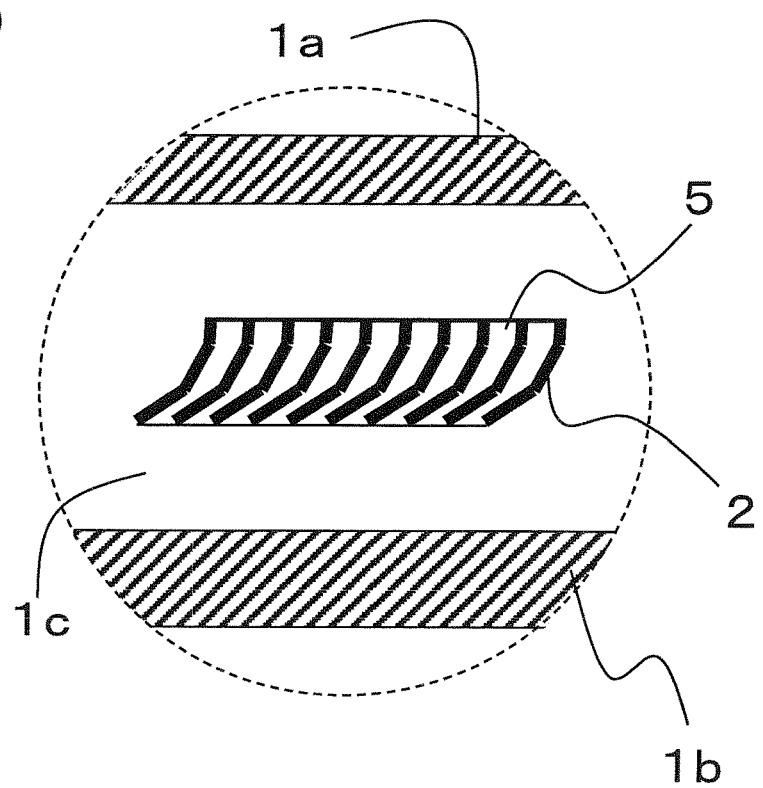
FIG. 5(b) is a cross-sectional view showing a partially extracted portion of a cross section along a direction in which a fluid flows.

FIG. 5 shows still another example of a flow path of the embodiment. FIG. 5(a) shows an external perspective view and a perspective view illustrating a cross section vertical to a direction in which a fluid flows, and FIG. 5(b) is a cross-sectional view showing a partially extracted portion of a cross section along a direction in which a fluid flows. The cross section of the grooves 5 on the third wall 1c is the same as in FIG. 3 and therefore the description thereof is omitted.

Also, in a flow path member 50 shown in FIG. 5, the first wall 1a is a lid, the second wall 1b is a bottom plate, and the third wall 1c is a side wall. A heat generation member mounted area (not shown) is provided in the first wall 1a which is the lid of the flow path member 50, and the heat generation member 6 is disposed in the heat generation member mounted area.

As shown in FIGS. 5(a) and 5(b), in the flow path member 50 of the embodiment, the grooves 5 are inclined to the heat generation member mounted area in multiple stages, so that an inclination angle becomes great.

With such a configuration, some of the fluid easily smoothly flows to the heat generation member mounted area side (that is, the heat generation member 6) of the first wall 1a or the second wall 1b. Accordingly, the heat exchange between the fluid and the first wall 1a or the second wall 1b, that is, the heat exchange between the fluid and the heat generation member mounted area easily occurs, and it is possible to more efficiently perform the heat exchange.

Figure 6A:
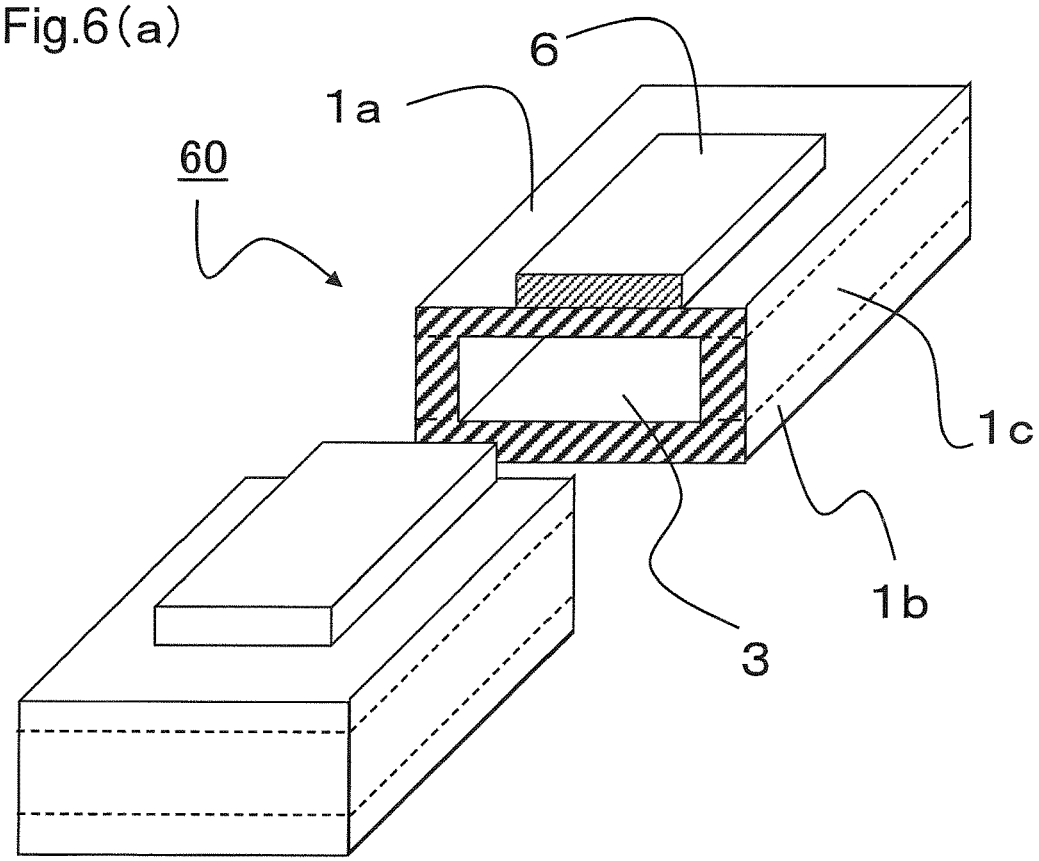
FIG. 6(a) shows an external perspective view and a perspective view illustrating a cross section vertical to a direction in which a fluid flows.
Figure 6B:
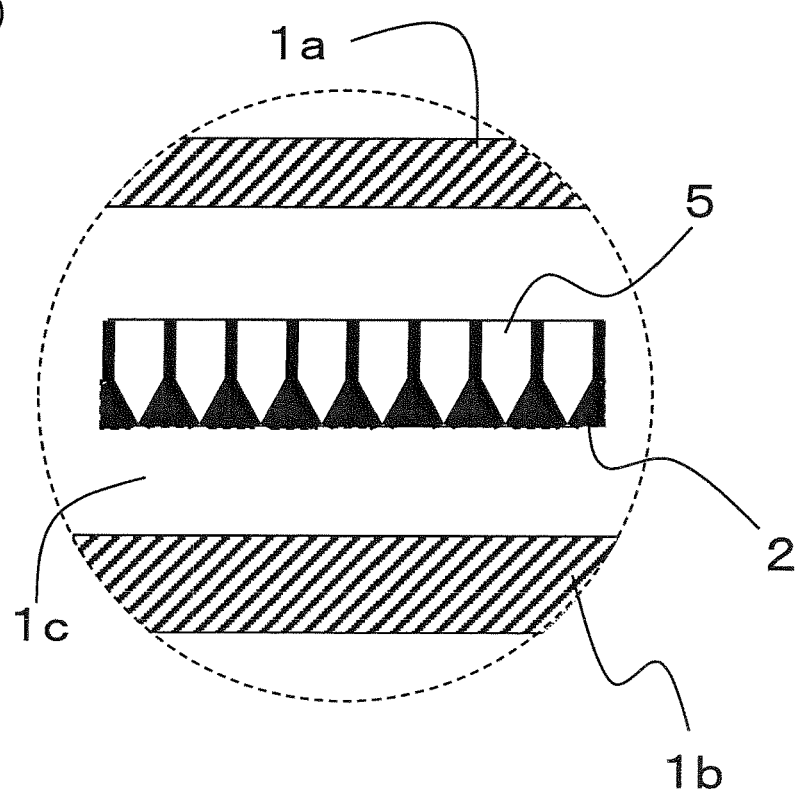
FIG. 6(b) is a cross-sectional view showing a partially extracted portion of a cross section along a direction in which a fluid flows.

FIG. 6 shows still another example of a flow path of the embodiment. FIG. 6(a) shows an external perspective view and a perspective view illustrating a cross section vertical to a direction in which a fluid flows, and FIG. 6(b) is a cross-sectional view showing a partially extracted portion of a cross section along a direction in which a fluid flows. The cross section of the grooves 5 on the third wall 1c is the same as in FIG. 3 and therefore the description thereof is omitted.

Also, in a flow path member 60 shown in FIG. 6, the first wall 1a is a lid, the second wall 1b is a bottom plate, and the third wall 1c is a side wall. A heat generation member mounted area (not shown) is provided in the first wall 1a which is the lid of the flow path member 60, and the heat generation member 6 is disposed in the heat generation member mounted area.

As shown in FIGS. 6(a) and 6(b), in the flow path member 60 of the embodiment, the heat generation member 6 is disposed on the first wall 1a and a width B of the grooves 5 is widened to the heat generation member mounted area side.

With such a configuration, a large amount of fluid easily smoothly flows to the heat generation member mounted area side (that is, the heat generation member 6) of the first wall 1a or the second wall 1b. Accordingly, the heat exchange between the fluid and the first wall 1a or the second wall 1b, that is, the heat exchange between the fluid and the heat generation member mounted area easily occurs, and it is possible to more efficiently perform the heat exchange.

Although not shown, in the heat exchanger of the embodiment, a metal member is provided on the surface or inside of at least one of the first wall 1a and the second wall 1b of the flow path members 1, 20, 30, 40, 50, and 60 of the embodiment.

When the heat generation member is disposed on at least one of the first wall 1a and the second wall 1b of such a heat exchanger, the heat generated by the heat generation member is efficiently transmitted to the metal member, and the transmitted heat is further transmitted to each wall, and therefore it is possible to efficiently perform the heat exchange with the fluid flowing through the flow path 3. This is particularly efficient in the heat exchanger of the embodiment, when the electronic component having a heat generation function such as an LED element or a power semiconductor is disposed as the heat generation member.

Figure 7:
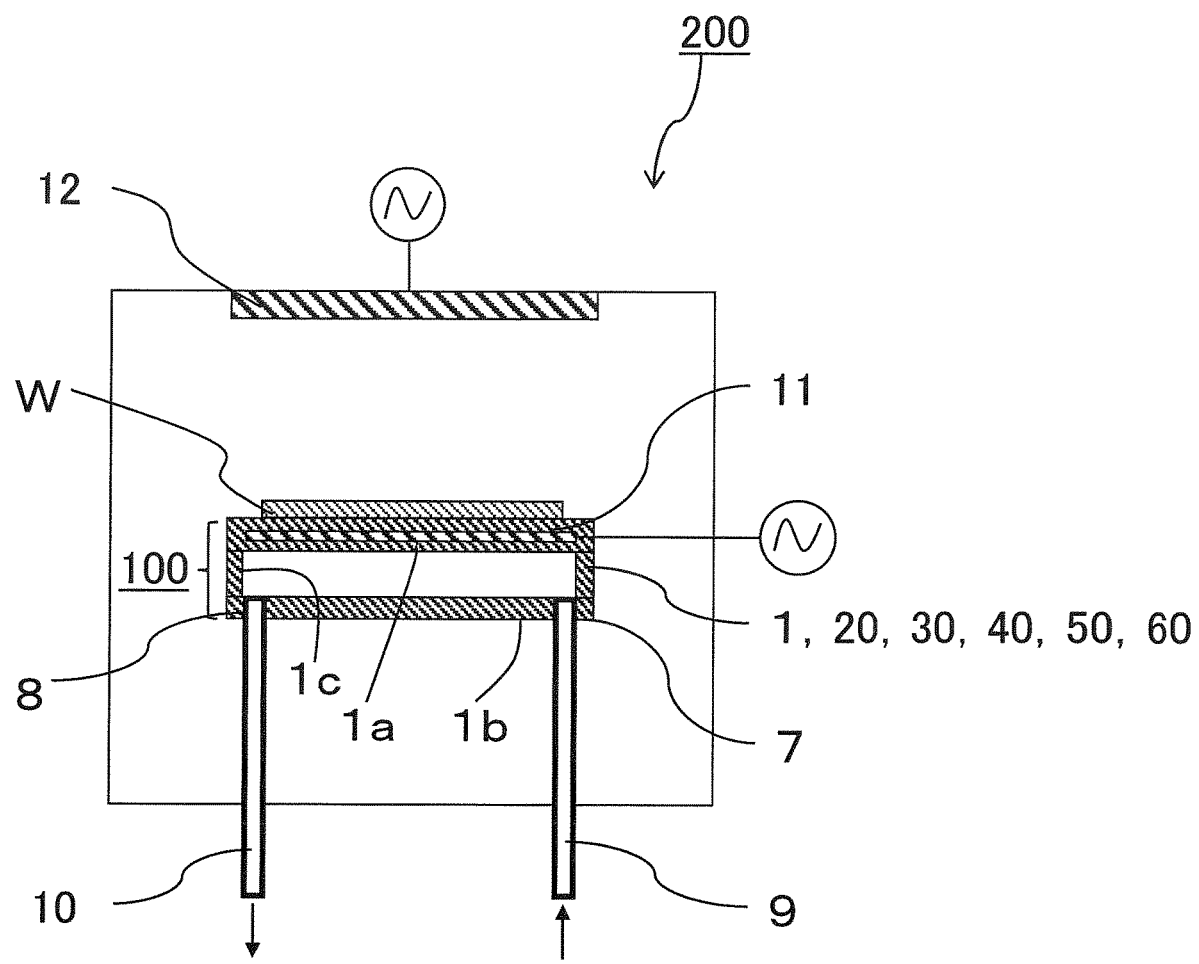
FIG. 7 is a schematic view showing an example of a semiconductor manufacturing apparatus including a flow path member of the embodiment.

FIG. 7 is a schematic view showing an example of a semiconductor manufacturing apparatus including the flow path member of the embodiment. A semiconductor manufacturing apparatus 200 is a plasma processing apparatus of a wafer W, and the wafer W is loaded on a heat exchanger 100 formed by providing the metal member 11 in the first wall 1a of the flow path members 1, 20, 30, 40, 50, and 60 of the embodiment. A supply tube 9 is connected to an inflow port 7, and a discharge tube 10 is connected to an outflow port 8. The fluid at a high temperature or a low temperature is circulated in the flow path included in the flow path members 1, 20, 30, 40, 50, and 60, and accordingly, the flow path members 1, 20, 30, 40, 50, and 60 perform the heating or cooling of the wafer W.

An upper electrode 12 for generating plasma is included on the upper side of the wafer W, and the metal member 11 in the first wall 1a of the flow path members 1, 20, 30, 40, 50, and 60 is used as a lower electrode for generating plasma. By applying a voltage between the metal member 11 which is the lower electrode and the upper electrode 12, the plasma can be generated between the electrodes 11 and 12, and the plasma can be applied with respect to the wafer W loaded on the first wall 1a. It is possible to cool the metal member 11 as the lower electrode heated at the time of plasma processing, and maintain the temperature thereof at a stable temperature. Accordingly, the temperature of the wafer W is also suppressed, and therefore it is possible to perform processing with a high dimensional accuracy. The metal member 11 of the semiconductor manufacturing apparatus 200 may be divided into a plurality of components, and may be a bipolar electrode formed of one electrode and the other electrode.

In FIG. 7, the example in which the metal member 11 is used as the lower electrode for plasma generation has been shown, but the metal member 11 can be used in heating of the fluid by causing the current to flow to the metal member 11, and adjusting of the temperature of the fluid.

The first wall 1a is formed of a dielectric material, and an electrostatic adsorption force such as a coulomb force or a Johnson-Rahbeck force is generated between the wafer W and a dielectric layer, by applying a voltage to the metal member 11 using the metal member 11 as an electrode for electrostatic adsorption, and therefore, it is possible to adsorb and hold the wafer W.

As described above, in the heat exchanger 100 of the embodiment, the metal member 11 is provided in at least one of the first wall 1a and the second wall 1b of the flow path members 1, 20, 30, 40, 50, and 60 of the embodiment, and therefore, it is possible to provide the heat exchanger 100 which has high heat exchange efficiency and withstands the use in the long term.

As described above, since the flow path members 1, 20, 30, 40, 50, and 60 of the embodiment have excellent durability or corrosion resistance and have high heat exchange efficiency, the semiconductor manufacturing apparatus 200 of the embodiment including these members can be set as a suitable semiconductor manufacturing apparatus with less obstacles in the manufacturing or inspecting of the semiconductor element. As the semiconductor manufacturing apparatus 200 of the embodiment, a sputtering apparatus, a resist coating apparatus, a CVD apparatus, or an etching processing apparatus is used, in addition to the plasma processing apparatus of FIG. 7 shown as an example, and it is possible to obtain the effects described above with these apparatuses, by providing the flow path members 1, 20, 30, 40, 50, and 60 of the embodiment therein.

An example of a manufacturing method of the flow path members 1, 20, 30, 40, 50, and 60 of the embodiment will be described.

First, regarding the manufacturing of the flow path members 1, 20, and 30, a process of obtaining a molded body to be the first wall 1a and a molded body of a base including a recess with the integrated second wall 1b and the third wall 1c, and bonding the first wall 1a and the base using an adhesive, to obtain a molded body of the flow path members 1, 20, and 30 will be described.

A ceramic raw material having a purity equal to or greater than 90% and an average particle diameter of approximately 1 μm is prepared, slurry obtained by adding and mixing predetermined amounts of a sintering-assistant agent, a binder, a solvent, and a dispersant thereto, is spray-dried and granulated by a spray granulation method (spray drying method), to have a secondary raw material. Then, the spray-dried and granulated secondary raw material is put into a rubber die having a predetermined shape and is molded by an isostatic pressing method (rubber pressing method), and then the molded body is extracted from the rubber die and is subjected to a cutting process.

In this cutting process, the molded body to be a base including the integrated second wall 1b and third wall 1c is formed to have a desired external shape, and the inflow port 7 and the outflow port 8 are formed in the portion of the flow path members 1, 20, and 30 to be the second wall 1b. The molded body to be a base is formed to have a desired external shape and forms a recess. The coarse portion 2 is formed on the third wall 1c of the recess.

Herein, the coarse portion may be formed on the third wall 1c to have the coarse portion 2 after baking, by a machining process using a well-known micro drill, a blast process, or a laser process, as a method of forming the coarse portion 2.

The protrusion 4 may be formed on the third wall 1c to have the height of the protrusion 4 from 500 µm to 3000 µm after baking, by a machining process using a well-known micro drill, a blast process, or a laser process, as a method of forming the protrusion 4. When forming the coarse portion 2 on the end surface of the protrusion 4, a machining process using a well-known micro drill, a blast process, or a laser process may be performed with respect to the end surface of the protrusion 4.

The grooves 5 may be formed on the third wall 1c to have the width B of the grooves 5 from 50 µm to 1000 µm and a depth C thereof from 20 µm to 500 µm after baking, by a machining process using a well-known micro drill, a blast process, or a laser process, as a method of forming the grooves 5. When forming the grooves 5 on the end surface of the protrusion 4, the protrusion 4 is formed by the method described above, and the grooves 5 may be formed on the end surface thereof by a machining process using a well-known micro drill, a blast process, or a laser process.

The ceramic molded body manufactured by a well-known pressing method, an extraction method, an injection molding method, as another method, may be formed as the third wall 1c by bonding and integrating the protrusion formed so as to have the coarse portion 2 or the grooves 5 on the end surface after baking, with the molded body thereof using an adhesive.

As the adhesive used in bonding herein, an adhesive formed of the slurry by mixing predetermined weighed amounts of a ceramic raw material, sintering-assistant agent, a binder, a solvent, and a dispersant used in the manufacturing the molded body to be a base, is used.

Next, a process of bonding the molded body to be the first wall 1a and the molded body to be the base will be described. As the adhesive used in bonding, an adhesive formed of the slurry by mixing predetermined weighed amounts of a ceramic raw material, a sintering-assistant agent, a binder, a solvent, and a dispersant used in the manufacturing of the molded body to be the first wall 1a and the molded body to be the base, is used. This adhesive is applied to a bonded portion of at least one of the molded body to be the first wall 1a and the molded body to be the base, and a bonded molded body obtained by integrating the molded body to be the first wall 1a and the molded body to be the base, is obtained. This bonded molded body is baked in an atmosphere according to the ceramic raw material, and accordingly it is possible to obtain the flow path members 1, 20, and 30 of the embodiment.

As the other example of the manufacturing method, the molded body to be the first wall 1a and the molded body to be the base are baked in an atmosphere according to the ceramic raw material, and the sintered body of the first wall 1a and the base is obtained.

The coarse portion 2 as a target may be formed on the third wall 1c of the base, by a machining process using a well-known micro drill, a blast process, or a laser process.

After that, this adhesive is applied to a bonded portion of at least one of the sintered body of the first wall 1a and the base to be integrated, using an adhesive formed of glass, and it is possible to obtain the flow path members 1, 20, and 30 of the embodiment by performing the heating process.

As the other example of the process of obtaining the molded body, green sheets may be formed using the slurry, by a doctor blade method or a roll compaction method which is a general molding method of ceramics, and may be laminated using a molded body obtained by punching in a desired shape by a die.

As an example thereof, in a slurry manufacturing method, first, silicon carbide powder having an average particle diameter from 0.5 µm to 2 µm, and powder of boron carbide and carboxylic acid salt, as a sintering-assistant agent, are prepared. The respective powder items are mixed by weighing 0.12% by weight to 1.4% by weight of the powder of boron carbide and 1% by weight to 3.4% by weight of the powder of carboxylic acid salt, with respect to 100% by weight of silicon carbide powder, for example.

Next, with this mixed powder, a binder such as polyvinyl alcohol, polyethylene glycol, an acrylic resin, or a butyral resin, water, and a dispersant are put in a ball mill, a rotating mill, a vibration mill or a beads mill and mixed with each other. Herein, the amount of the binder added may be set so that excellent strength or flexibility of the molded body is obtained and the degreasing of the binder for molding becomes insufficient at the time of baking, and the slurry manufactured as described above may be used.

The coarse portion 2 may be formed by a machining process using a well-known micro drill, a blast process, or a laser process, after punching in a desired shape by a mold formed with the shape of the coarse portion 2 or punching in a shape of the flow path 3, as a method of forming the coarse portion 2.

After that, a plurality of green sheets manufactured as described above are laminated so as to obtain the desired flow path 3, but the same slurry as that used when manufacturing the green sheets is applied to the bonded surface of each green sheet as an adhesive, and the green sheets are laminated on each other, and then, a pressure at an approximately 0.5 MPa is applied through a flat plate shaped pressing tool, and drying is performed at a room temperature of approximately 50° C. to 70° C. for about 10 hours to 15 hours.

Next, the green sheets laminated to be the flow path members 1, 20, and 30 are baked in a well-known pressure-type or a roller-type continuous tunnel furnace, for example. A baking temperature is different depending on the material thereof, and for example, when the silicon carbide is a material of the main component, the green sheets may be held in a temperature range of 1800° C. to 2200° C. for 10 minutes to 10 hours, and then may be baked in a temperature range of 2200° C. to 2350° C. for 10 minutes to 20 hours, in an inert gas or vacuum atmosphere.

Herein, in order to form the metal member 11 on the first wall 1a, for example, aluminum or copper may be formed by a well-known printing method or formed by a vapor deposition method, an aluminum plate or a copper plate may be bonded using an active metal method or a soldering method, or aluminum or copper may be filled in a hole by forming the hole on the first wall 1a. By performing the formation as described above, it is possible to obtain the heat exchanger 100.

In the flow path members 1, 20, and 30 of the embodiment obtained as described above, when the coarse portion 2 which is coarser than the other portion 13 is provided in a part of the surface of the third wall 1c on the flow path 3 side, the turbulent flow easily occurs in the fluid, and it is possible to obtain the flow path members 1, 20, and 30 having improved heat exchange efficiency. In addition, particularly, when the semiconductor manufacturing apparatus 200 includes the heat exchanger 100 including the flow path members 1, 20, and 30 of the embodiment, it is possible to perform the manufacturing or the inspection of the semiconductor element, without obstacles.

In order to obtain the flow path member 40 or 50 in which the grooves 5 having the shape shown in FIG. 4 or FIG. 5 are formed, for example, a head holding a micro drill is inclined or turned in a case of the machining process, a head holding an injection port is inclined or turned in a case of the blast process, or a head holding an emission port is inclined or turned in a case of the laser process, from the third wall 1c on the flow path 3 side, and accordingly, it is possible to obtain the flow path member 40 or 50 having the grooves 5 in the shape shown in FIG. 4 or FIG. 5.

In order to obtain the flow path member 60 in which the grooves 5 having the shape shown in FIG. 6 are formed, for example, regarding the third wall 1c on the flow path 3 side, from the lid portion side 1a, a micro drill having a decreased diameter of the end surface is used in a case of the machining process, or spray velocity or laser output is adjusted in a case of the blast process and the laser process, and therefore, it is possible to obtain the flow path member 60 including the grooves 5 in the shape shown in FIG. 6.

REFERENCE SIGNS LIST 1, 20, 30, 40, 50, 60 FLOW PATH MEMBER
1a LID PORTION
1b BOTTOM PLATE PORTION
1c SIDE WALL
2 COARSE PORTION
3 FLOW PATH
4 PROTRUSION
5 GROOVE
6 HEAT GENERATION MEMBER
7 INFLOW PORT
8 OUTFLOW PORT
9 SUPPLY TUBE
10 DISCHARGE TUBE
11 METAL MEMBER
13 OTHER PORTION
100 HEAT EXCHANGER
200 SEMICONDUCTOR MANUFACTURING APPARATUS
W WAFER

The invention claimed is:

1. A flow path member for use in a semiconductor manufacturing apparatus, comprising:
a first plate including a mounting surface for a heat generation member;
a second plate facing the first plate; and
a third plate between the first plate and the second plate, the first and second plates each longer in width than the third plate,
wherein a flow path in which a fluid flows in a first direction is configured with the first plate, the second plate, and the third plate,
the third plate on a flow path side includes a plurality of protrusions protruding to the flow path, each protrusion comprising a surface facing the fluid with a coarse portion thereon including a coarseness, which is a surface roughness, that is coarser than a coarseness of other portions of the third plate on the flow path side that face the fluid, and
the plurality of protrusions are provided along a direction in which the fluid flows,
wherein the coarse portion includes grooves spaced from the first plate and the second plate, and the grooves are wider closer to the mounting surface compared to away from the mounting surface.

2. The flow path member according to claim 1, wherein two of the protrusions next to each other in the first direction are shifted in a direction from the first plate to the second plate.

3. The flow path member according to claim 1, wherein a center of the end surface of the protrusion is curved to a third plate side.

4. The flow path member according to claim 1, wherein the grooves are inclined to the mounting surface.

5. The flow path member according to claim 4, wherein the grooves are inclined to the mounting surface in multiple stages such that an inclination angle becomes large.

6. A heat exchanger, comprising:
the flow path member according to claim 1; and
a metal member on or inside of at least one of the first plate and the second plate of the flow path member.

7. A semiconductor manufacturing apparatus comprising:
the heat exchanger according to claim 6,
wherein the metal member is inside of at least one of the first plate and the second plate of the flow path member, and
wherein the metal member is an electrode for attracting a wafer.

8. The flow path member according to claim 1, wherein the first, second and the third plates contain ceramics.

9. The flow path member according to claim 8, wherein the ceramics includes alumina, zirconia, silicon nitride, aluminum nitride, silicon carbide, boron carbide, cordierite, mullite, or the combination thereof.

10. The flow path member according to claim 1, wherein the plurality of protrusions each has a height in a range of 500 to 3000 μm.

* * * * *